(12) United States Patent
Li et al.

(10) Patent No.: US 8,525,417 B2
(45) Date of Patent: *Sep. 3, 2013

(54) DISCHARGE ELECTRODE ARRAY FOR THIN-FILM SOLAR CELL DEPOSITION

(75) Inventors: Zhijian Li, Shenzhen (CN); Yi Li, Shenzhen (CN); Zhubing He, Shenzhen (CN); Shengming Hu, Shenzhen (CN); Chunzhu Wang, Shenzhen (CN); Jianhua Zhou, Shenzhen (CN)

(73) Assignee: Shenzhen TRONY Science & Technology Development Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/698,747

(22) PCT Filed: Oct. 21, 2010

(86) PCT No.: PCT/CN2010/001655
§ 371 (c)(1),
(2), (4) Date: Nov. 19, 2012

(87) PCT Pub. No.: WO2011/153671
PCT Pub. Date: Dec. 15, 2011

(65) Prior Publication Data
US 2013/0063018 A1    Mar. 14, 2013

(30) Foreign Application Priority Data

Jun. 11, 2010   (CN) .......................... 2010 1 0198710

(51) Int. Cl.
*H01J 1/02*    (2006.01)

(52) U.S. Cl.
USPC ...... 315/85; 118/723 R; 118/723 E; 118/500; 313/326; 315/111.21; 156/345.44

(58) Field of Classification Search
USPC .................... 118/500, 723 R, 723 E; 315/85, 315/111.21; 156/345.44; 313/326
See application file for complete search history.

(56) References Cited

U.S. PATENT DOCUMENTS

| | | | | |
|---|---|---|---|---|
| 8,291,858 B2 * | 10/2012 | Hu et al. | ................... | 118/723 E |
| 8,297,226 B2 * | 10/2012 | Li | ............... | 118/723 E |
| 8,356,572 B2 * | 1/2013 | Li | .................. | 118/500 |
| 2013/0063018 A1 * | 3/2013 | Li et al. | ........................ | 313/326 |
| 2013/0063028 A1 * | 3/2013 | Hu et al. | .................. | 315/111.21 |

* cited by examiner

*Primary Examiner* — Sylvia R Macarthur
(74) *Attorney, Agent, or Firm* — Anova Law Group, PLLC

(57) ABSTRACT

A discharge electrode array for a silicon-based thin film solar cell deposition chamber is provided, relating to solar cell technologies. The discharge electrode array includes a signal feed component having a rectangular-shaped end, a flat waist corresponding to a feed-in port located in a hallowed rectangular area on a center region of a cathode plate having a shielding cover, connecting a feed-in power supply signal by surface contact. The electrode array includes at least a set of cathode plates and an anode plate, with two cathode plates sharing or surrounding one anode plate. Uniform large area and stable discharge driven by the RF/VHF power supply signal can be achieved, and the standing wave and the skin effect can be effectively removed. The production efficiency can be improved and the cost can be reduced.

15 Claims, 5 Drawing Sheets

DISCHARGE ELECTRODE ARRAY FOR THIN-FILM SOLAR CELL DEPOSITION

FIELD OF THE INVENTION

The present invention generally relates to solar cell technologies and, more particularly, to a discharge electrode array in a deposition box driven by VHF (27.12 MHz~100 MHz) power supply signals for silicon-based thin film solar cells.

BACKGROUND

Currently, silicon-based thin film solar cells often use plasma enhanced chemical vapor deposition (PECVD) to deposit single-junction or multi junction photovoltaic PIN film layers. This type of radio-frequency (RF) capacitively-coupled parallel plate reactor is commonly used in the thin film solar cell industry. The deposition process, such as plasma-enhanced chemical vapor deposition, is conducted in the reaction chamber through electrode plate components within electrode plate arrays. RF capacitively-coupled parallel-plate electrode reaction chamber is widely used in various kinds of large-area thin-film deposition of amorphous silicon, amorphous silicon germanium, silicon carbide, silicon nitride, and silicon oxide materials, etc. Industry-wide, the electrode with a supporting frame is usually called a clamping unit, a holder, or a fixture, and the plasma chemical vapor deposition apparatus with installed holders inside the vacuum chamber is often called the "deposition box," i.e., the reaction chamber.

The silicon thin film solar cell sector is an important branch of the solar energy industry, and the parallel plate electrode capacitive discharge pattern is one of the core technologies of the solar cell industry. Further, 13.56 MHz RF is widely used in high-speed amorphous silicon thin film deposition with high production efficiency and low process cost. With the rising demand for silicon thin film technology, more attentions have been given to microcrystalline and nanocrystalline silicon thin film materials.

However, in a microcrystalline environment, plasma generated by 13.56 MHz RF may have low plasma concentration, low deposition rate, long deposition period to reach targeted film thickness, and significant background pollution. Thus, the prepared thin film often has high impurity and poor photoelectric properties, which seriously affects the quality and performance of the products. How to make high-speed deposition becomes key for crystalline silicon thin-film technology to successfully serve the industry.

Very high frequency (VHF) is referred to the legitimate frequency which is twice or more of 13.56 MHz. In the industry, the VHF mostly used is generally in the range of 27.12~100 MHz. However, in the capacitive discharge model, standing wave effect and skin effect caused by VHF become very obvious, and these effects become stronger when the driving frequency increases. Professor M. A. Lieberman of University of California, Berkeley made a thorough investigation on these two effects. His research results show that the critical condition for VHF PECVD deposition of uniform thin films is that the free space wavelength of excitation frequency ($\lambda_0$) is much larger than the capacitive discharge electrode chamber size factor (X), and the skin depth ($\delta$) is much larger than the thickness tolerance factor ($\eta_0$). For example, on 1 m$^2$ of discharging area and with an excitation frequency of 60 MHz, $\lambda_0 \approx X$ and $\delta \approx \eta$. Therefore, under this excitation frequency, the skin effect and the standing wave effect become very obvious, leading to an uneven discharge on the electrode plate of 1 m$^2$. Thus, how to achieve a large area of uniform discharge driven by VHF is one of the technical problems to be resolved for the crystalline silicon thin-film technology.

This also caused great interest in the industry. In 2003, U.S. Patent 2003/0150562A1 disclosed a method using a magnetic mirror in the capacitively-coupled discharge to improve the inhomogeneity caused by VHF. Chinese patents 200710150227.4, 200710150228.9, and 200710150229.3 disclosed three electrode designs of VHF, applying different feed-in forms of VHF signals to obtain uniform electric fields.

However, the following problems may still remain: 1) The electrodes in the VHF-PECVD chamber have complex design structures; 2) One reason for the continuous improvement is that the constant assembly/disassembly and cleaning of the reaction chamber and electrodes can cause abnormal deformation of the electrodes; 3) The multi-point feed-in structures disclosed in the existing patents may have a small contact surface, which requires symmetrical paths of individual feed-in points and there is no contact between the bonding conductors at the feed-in points and the cathode plate. More specifically, a shield of isolation may be needed between the bonding conductor and the cathode plate for effective discharge. These structural designs have relatively harsh actual requirements, have too many determination factors for uniform discharge, and cannot meet the actual production needs such as disassembly and cleaning.

Therefore, for the equipment used by the industry, a single point feed-in becomes the mainstream design. But due to the standing wave effect and the skin effect, current single-point feed-in structures cannot meet the requirement for increasing the high feed-in frequency. Thus, further development and improvement may be needed to make the existing deposition holders more practical to meet the current market demand and to reduce the cost. Meanwhile, it is also a trend to use CVD reactor system capable of processing or depositing multiple glasses. Therefore, it is of great practical significance for the industry to apply an effective VHF feed-in model to meet the demand of mass production and to enter the industrial production stage.

CONTENTS OF THE INVENTION

The objectives of the invention include solving the non-uniformity problem of VHF power-driven discharge system, and providing a large-area VHF-PECVD deposition chamber with a uniform electric field through using a new conceptual design of the electrode array having electrode plate components, which is applied in the production of large area VHF-PECVD electrode multi-plate array.

Accordingly, the deposition box technology solutions in the invention include: electrode plate components and signal feed-in components. The electrode plate components having shielding covers and the signal feed-in components form an electrode array. Specifically, the electrode array includes at least one group of cathode plates and an anode plate, two signal feed-in components respectively corresponding to two working surfaces of the cathode plates by feed-in ports in surface contact with the working surfaces, and input Radio Frequency (RF) or Very High Frequency (VHF) power supply signals.

The feed-in port is located in a hollowed rectangular area at the center of the backside of an electrode plate component; and the signal feed-in component comprises a Z-shape feed-in belt having a copper feeding core with an outer insulating layer. One end surface of the feed-in belt is in a rectangular shape.

In certain disclosed technical solutions, the electrode array includes an anode plate, cathode plates, shielding covers of the cathode plates, and signal feed-in components coupled to the feed-in ports. The anode plate has two working surfaces, and the two working surfaces respectively faces effective working surfaces of two symmetrically-arranged cathode plates facing towards the two working surfaces of the anode plate. The signal feed-in component comprises a Z-shape feed-in belt having a copper feeding core with an outer insulating layer. One conductive end surface of the feed-in belt is in a rectangular shape. The electrode array can include multiple sets of signal feed-in components coupled to cathode plates with shielding covers and less than half cathode plate number of grounded anode plates to form an array of electrode plates with a certain discharge distance/space.

The single-side discharging cathode plate has a working surface and non-working surfaces. The shielding cover, formed by a ceramic insulating layer and a shielding layer, covers the backside and surrounding sides of the cathode plate, providing shielding of the center position of the backside of the cathode plate and the surrounding sides for feeding in RF/VHF power supply signals.

With respect to the signal feed-in component, one end is in a rectangular shape and connects with the feed-in port, and the other end connects with a negative output port of the RF/VHF power supply signal and a power supply matching device.

The solution of the present invention provides a method, in which the electrode array, formed by the electrode plate components and signal feed-in components, uses a surface feed-in mode. The one end of the signal feed-in component is of a rectangular shape and makes surface contact with a feed-in port of the electrode plate component to feed-in RF/VHF power supply signals. The feed-in port of the electrode plate component is located in a hollowed rectangular area at the center of the backside of the cathode plate with the shielding cover.

The disclosed electrode array includes multiple sets of signal feed-in components coupled to electrode plate components to feed-in RF/VHF power supply signals to the feed-in ports of the electrode plates in a surface feed-in mode. The signal feed-in component may be a Z-shape metal belt or strip. One end is in a rectangular shape and the outer shell is insulated and shielded. The belt has a ceramic insulating layer and a metal feeding core, which has VHF signal feeding lines.

The beneficial effects of the present invention, different from the slot-type cathode plate with side-feed modes, include that the present invention can achieve the higher uniformity, greater discharge area and more stable discharge performance. Further, the connection capacitance is smaller, the actual discharge power is greater, and the radio frequency interference between electrode plate arrays is smaller. Also different from cathode plate center-point-type feed mode of the single chamber deposition system, the connection capacitance is smaller, the standing wave and the skin effect is smaller or is effectively eliminated, and the integrated array type multi-chamber deposition can be obtained to greatly improve production efficiency. Therefore, through optimizing VHF power feed-in mode and the electrode plate structure, the solution of RF/VHF discharge uniformity can be obtained, and it is the premise of high efficient preparation technology for crystallized silicon thin film. The invention is applicable for any power and legitimate VHF frequencies in the range of 27.12 MHz~200 MHz for large area uniform discharge. This structure can be applied to multiple-glasses deposition systems for greatly improving the productivity and reducing the cost of solar cells. The invention breaks through the conventional electrode design technical limitations, effectively eliminates the VHF inducing effects such as a standing wave and the skin effect, and improves uniform discharge to industrial application level.

BRIEF DESCRIPTION OF THE DRAWINGS

In FIG. 1-5, the electrode plate component includes a cathode plate 203 and cathode shielding cover 204, between which there is placed an insulation layer 207, and anode plates 208. The cathode shielding cover 204 and the anode plates 208 are grounded. The Z-shaped signal feed-in component 201 includes a waist having an insulation cover 202 and a rectangular-shaped signal feed-in surface 201-1, which corresponding to the feed-in port 203-1 located at a hollowed rectangular area at the center of the backside of the cathode electrode plate. The waist is flat for easy installation and less signal feed-in loss. The electrode array discharges in the vacuum chamber 01 to deposit the P-I-N film layer on substrate 206. The vacuum chamber 01 contains the feed-in inlet 101 of gas access system, the power supply feeding system inlet 102, vacuum chamber door, and the feed-in inlet 105 of the vacuum system.

Figure 1:
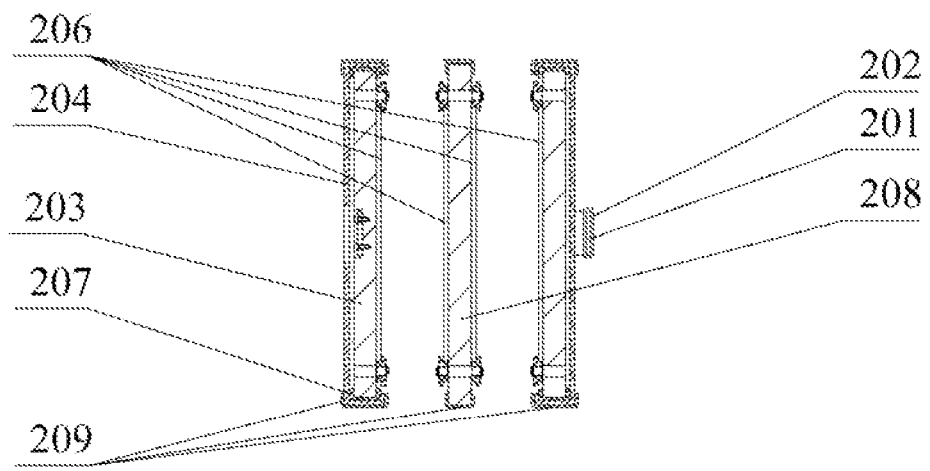
FIG. 1 illustrates an exemplary electrode array and embodiment 1 according to the present invention.
Figure 2:
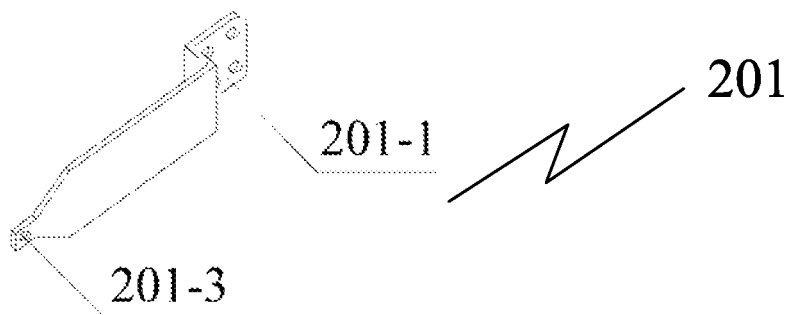
FIG. 2 is a schematic diagram of the signal feed-in component 201 of FIG. 1.
Figure 3:
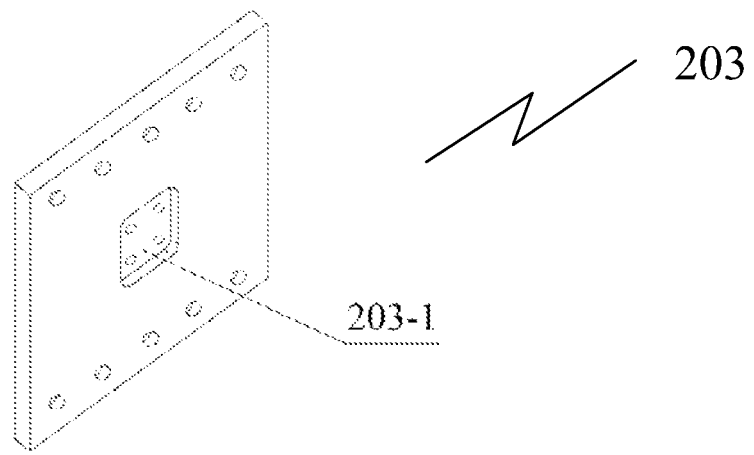
FIG. 3 is a schematic diagram of the cathode plate 203 of FIG. 1.
Figure 4:
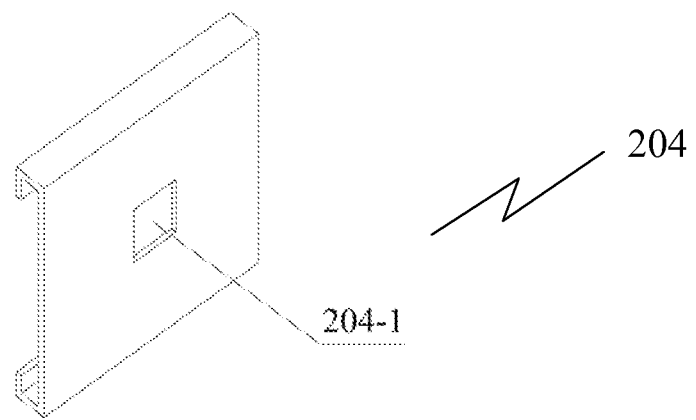
FIG. 4 is a schematic diagram of the cathode plate shield 204 of FIG. 1.

The disclosed electrode array achieves the above proposed invention task through a surface contact feed-in mode. It has overcome many problems from multi-point feed-in techniques in VHF-PECVD deposition of crystallized silicon thin film, such as that the electrode structure of reaction chamber is complex, electrode easily deforms, contact area is small, path and distance between the feed-in points require completely symmetric and fully shielded, etc. The surface feeding deposition box design of the invention solves these problems and can obtain a large area chamber discharge with uniform electric field. It especially can achieve high efficient utilization of the dual work surfaces of the anode plate. Meanwhile, for the CVD electrode array system for treating or depositing multiple pieces of glass substrates, the effective VHF surface feed-in mode is used so that the industrial production operation process is achieved and the silicon-based thin film solar cell mass production needs can be met.

Contribution of this invention includes providing a desired solution to uniformity and consistency problems of thin-film deposition driven by a very-high-frequency (VHF) electrical power source at a high deposition rate. The electrode array comprising anode plates 208, cathode plates 203, cathode plate shielding covers 204, and signal feed-in components 201 is installed inside the vacuum chamber 01. Feed-in port 203-1 at the center region of the cathode plate is rectangular-shaped. The feed-in end 201-1 of the corresponding signal feed-in component 201 is also rectangular-shaped. The feed-in components 201 is Z-shaped, having a flat waist for easy installation and with less feed-in signal loss. The end of the feed-in component is of a rectangular shape, connects in surface-contact mode with the electrode plate to form the electrode-plate component in the vacuum chamber with grounding setting, which all have insulating shields.

DETAILED DESCRIPTION OF THE EMBODIMENTS

Embodiment 1

The principle of this embodiment is illustrated with FIGS. 1-4. As shown, two cathode plates 203 surround one anode plate 208 to form two pairs of electrodes. Four pieces of substrates 206 can be deposited at the same time. More pairs of electrodes can be arranged in an array to improve efficiency of the electrode array.

The vapor deposition system includes vapor deposition chamber, gas system, electrical power system, vacuum system, heating system, control system, and so on (not all shown). The gas system mainly provides different gases and gas lines for vapor deposition. Electrical power system mainly provides high-frequency or very-high-frequency electrical power source to discharge plasma for film deposition. Vacuum system mainly provides vacuum pumping machines and vacuum pipelines. Heating system mainly supplies heat for vapor deposition chamber. Control system mainly controls the parameters of deposition process. Vapor deposition chamber is the apparatus for realizing thin film deposition with gases on substrate 206.

The vapor deposition chamber mainly comprises vacuum chamber 01 and an electrode array. Vacuum chamber 01 is used to achieve vacuum. The electrode array is used to discharge plasma and deposit P-I-N thin film layers on substrate 206. The electrode array includes cathode plate 203, cathode shielding cover 204, ceramic insulating layer 207, anode plate 208, signal feed-in component 201, and outside shielding layer 202.

The vacuum chamber 01 includes grounded metal groove 209, used to fix anode plate 208, cathode plate 203, and cathode shielding cover 204. Anode plate 208 is directly inserted into and contacts metal groove 209, making cathode shielding cover 204 contact metal groove 209. Ceramic insulating layer 207 is fixed between cathode 203 and cathode shield 204 to make these two parts out of contact.

Anode plate 208 and cathode shielding cover 204 contact metal grooves 209, which contacts with the vacuum chamber 01 to be grounded. A feed-in port 203-1 is located in a hallowed rectangular area in the middle or center of the backside of the cathode plate 203. The signal feed-in component 201 is a Z-shaped feed-in strip. One end of the feed-in belt is in rectangular shape and in surface contact with the feed-in port 203-1 on the cathode plate to feed the radio-frequency/very-high-frequency signal power source to the cathode plate 203. The cathode shielding cover 204 covers the entire back and side surfaces of the cathode plate.

Through-hole 204-1 in the middle of cathode shielding cover 204 is configured corresponding to the feed-in port 203-1 and makes signal feed-in component 201 coming through cathode plate 203 without touching cathode shielding cover 204. The feed-in component is covered with outside insulating and shielding layer 202 to avoid contacting with cathode shielding cover 204. After substrates 206 are fixed on the electrode plates, the electrode array is placed in the vacuum chamber 01. Desired vacuum state of vacuum chamber can be achieved by using the vacuum system. Then deposition gases are added into the vacuum chamber, and thin-film vapor deposition process can be completed.

Embodiment 2

The cathode plate has a rectangular feed-in port. The feed-in component has a flat waist as the feed-in belt, one end of which is in a rectangular shape and in surface contact with the feed-in port of the cathode plate.

Figure 5:
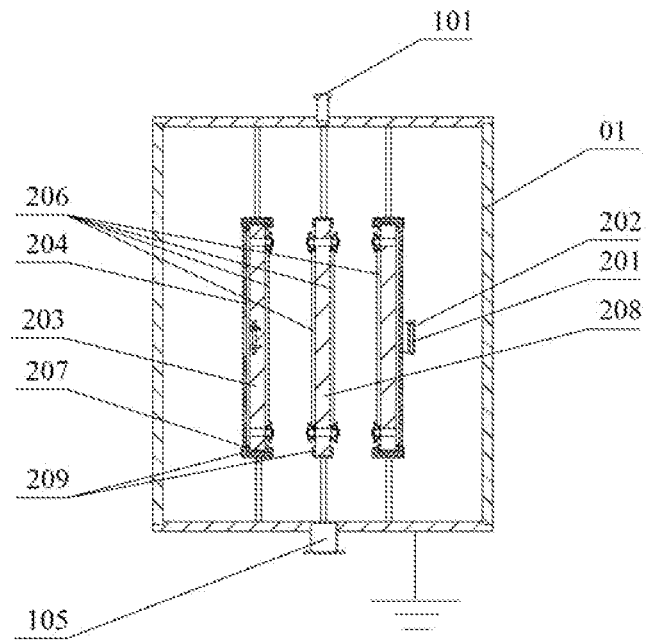
FIG. 5 is a schematic diagram of the Embodiment 2 of the invention.

The electrode array in FIG. 5 is similar to that in Embodiment 1. A vertical deposition box or reaction chamber is used. Two cathode plates 203 surround one anode plate 208 to form two pairs of electrodes, and 4 glass substrates 206 can be processed. In such a configuration, four substrates can be coated with thin films at the same time. Detailed processes are illustrated as follows:

a) Placing 4 glass substrates 206 (1640 mm×707 mm×3 mm) with 600-nm transparent conducting thin films in the substrate position in vacuum chamber 01. Film side of the substrate faces outside, while glass side of the substrate faces toward electrode plate.

b) Filling the vacuum chamber with argon when vacuum reaches $5.0 \times 10^{-4}$ Pa. When the pressure reaches approximately 60 Pa, turning on the 40.68 MHz very-high-frequency power source, and cleaning the chamber with 400 W plasma discharge for 2 minutes. Then turning off the electrical power source.

c) Afterwards, pumping down the system to a high vacuum of $\sim 5.0 \times 10^{-4}$ Pa, and then wash the system with argon twice.

d) Adding gas mixture (silane and hydrogen) to the chamber with a flow rate of 5 slpm. Turning on the 40.68 MHz very-high-frequency power source when pressure of the chamber reaches 60 Pa to discharge with 400 W power and deposit micro-crystalline intrinsic silicon thin films for 40 minutes.

e) Turning off the power source, and pump down the system to high vacuum.

f) Filling the chamber with nitrogen gas to atmospheric pressure, open the door of the chamber, and then cool the TCO glasses at room temperature.

Figure 7:
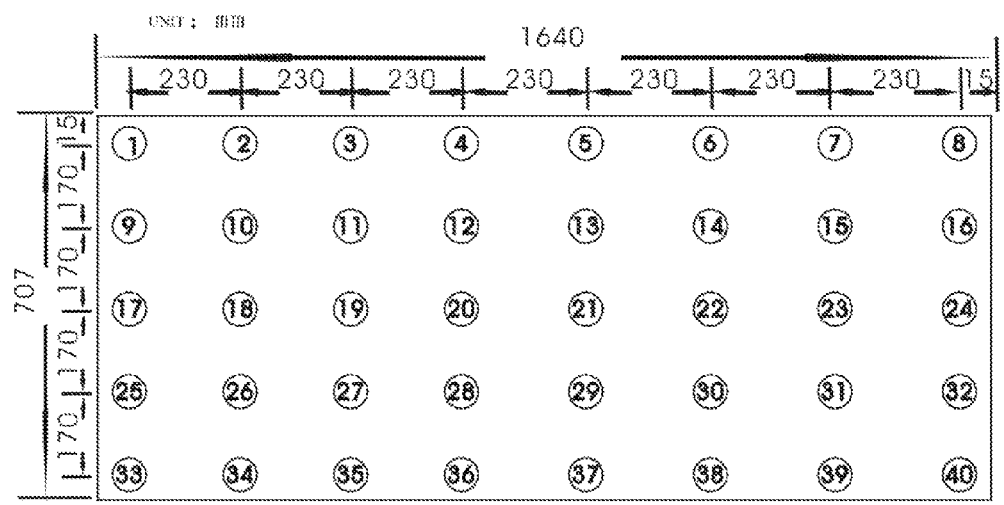
FIG. 7 is a sampling distribution diagram of film thickness testing.

After the completion of the deposition process, 40 points on each glass substrate 206 are sampled as shown in FIG. 7 (as location numbers) to detect the thickness of the various sampled points. The microcrystalline silicon film thickness testing results of a substrate 206 are shown in Table I:

TABLE I

The unit of the film thickness is nm, the numbers in the parentheses are the location numbers in FIG. 7

| 697 | 717 | 721 | 724 | 719 | 718 | 704 | 710 |
|---|---|---|---|---|---|---|---|
| (1) | (2) | (3) | (4) | (5) | (6) | (7) | (8) |
| 719 | 741 | 741 | 754 | 740 | 735 | 727 | 721 |
| (9) | (10) | (11) | (12) | (13) | (14) | (15) | (16) |
| 727 | 737 | 740 | 740 | 739 | 740 | 738 | 724 |
| (17) | (18) | (19) | (20) | (21) | (22) | (23) | (24) |
| 715 | 730 | 737 | 739 | 734 | 736 | 727 | 731 |
| (25) | (26) | (27) | (28) | (29) | (30) | (31) | (32) |
| 717 | 728 | 729 | 735 | 730 | 729 | 730 | 724 |
| (33) | (34) | (35) | (36) | (37) | (38) | (39) | (40) |

Figure 8:
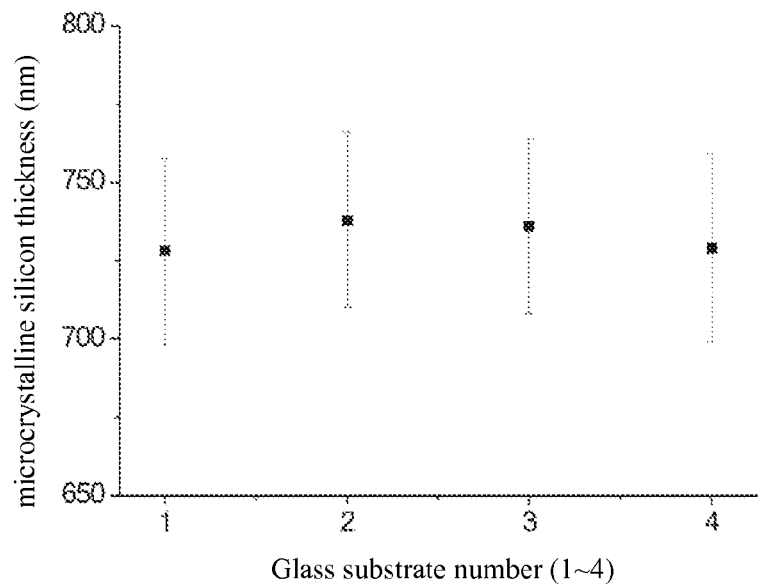
FIG. 8 illustrates thickness distributions of the microcrystalline silicon films deposited on the electrode plate by four different electrode glasses according to embodiment 2 of the present invention.
Figure 9:
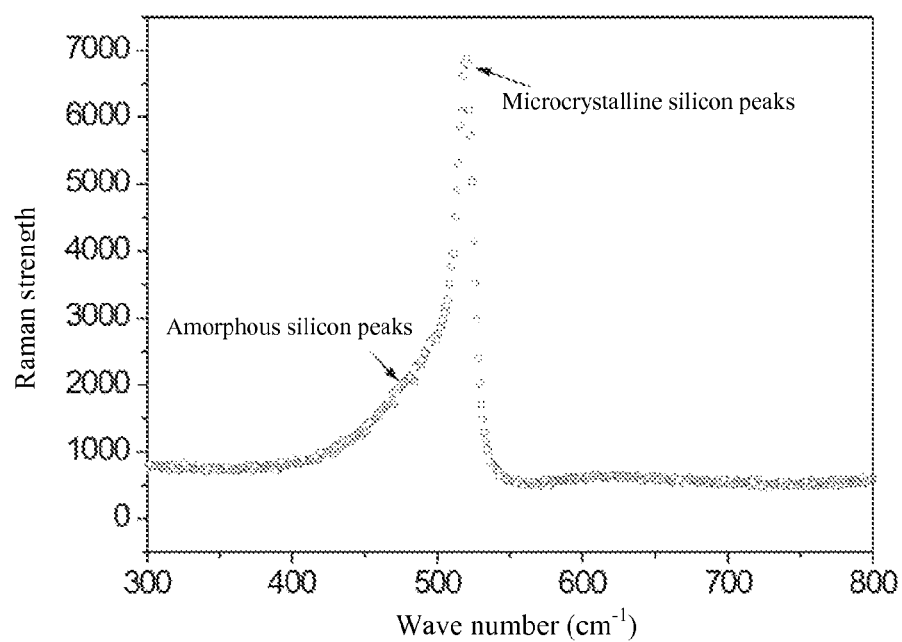
FIG. 9 is a typical Raman spectra of the microcrystalline silicon in Embodiment 2 of the present invention.

The differences of the microcrystalline silicon film thickness of the four glass substrates is shown in FIG. 8, and the typical microcrystallization degrees of the films are shown in FIG. 9.

Based on the above data, it can be determined that, with this feed-in configuration, uniform electric field driven by 40.68 MHz very-high-frequency power source can be achieved, and micro-crystalline silicon thin films can be deposited on 1640 mm×707 mm (length×width) TCO glass with a uniformity of ~5% and adjustable micro-crystallization degree.

Embodiment 3

The cathode plate has a rectangular feed-in port. The feed-in component has a flat waist as the feed-in belt, one end of which is in a rectangular shape and in surface contact with the feed-in port of the cathode plate.

Figure 6:
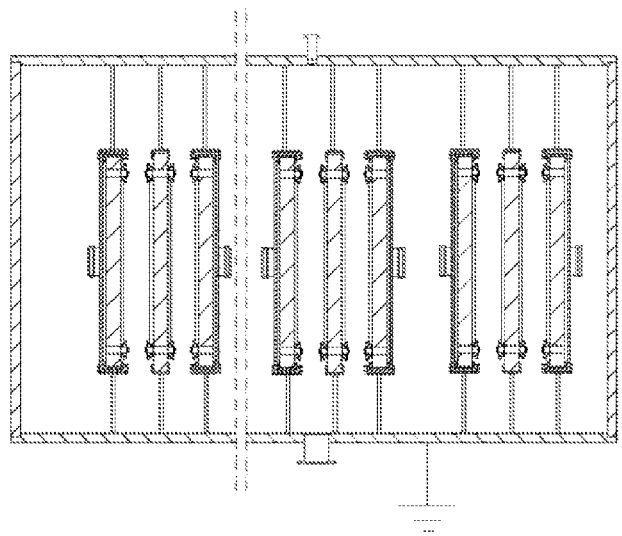
FIG. 6 is a schematic diagram of the Embodiment 3 of the invention.

The electrode array in FIG. 6 is similar to that in Embodiment 1. A vertical deposition box or reaction chamber is used. Twelve cathode plates 203 and six anode plates 208 form twelve pairs of electrodes, with two cathode plates 203 coupled to or surrounding one anode plate 208 to form two pairs of electrodes, and 24 glass substrates 206 can be processed. In such a configuration, twenty four substrates can be coated with thin films at the same time.

a) Placing 24 glass substrates 206 (1640 mm×707 mm×3 mm) with 600-nm transparent conducting thin films in 24 substrate position in vacuum chamber 01 arranged from left to right. Film side of the substrate faces outside, while glass side of the substrate faces toward electrode plate.

b) Filling the vacuum chamber with argon when vacuum reaches $5.0 \times 10^{-4}$ Pa. When the pressure reaches approximately 60 Pa, turning on the 40.68 MHz very-high-frequency power source, and cleaning the chamber with 400 W plasma discharge for 2 minutes. Then turning off the electrical power source.

c) Afterwards, pumping down the system to a high vacuum of $\sim 5.0 \times 10^{-4}$ Pa, and then wash the system with argon twice.

d) Adding gas mixture (silane and hydrogen) to the chamber with a flow rate of 5 slpm. Turning on the 40.68 MHz very-high-frequency power source when pressure of the chamber reaches 60 Pa to discharge with 400 W power and deposit micro-crystalline intrinsic silicon thin films for 60 minutes.

e) Turning off the power source, and pump down the system to high vacuum.

f) Filling the chamber with nitrogen gas to atmospheric pressure, open the door of the chamber, and then cool the TCO glasses at room temperature.

After the completion of the deposition process, 40 points on each glass substrate 206 are sampled as shown in FIG. 7 to detect the thickness of the various sampled points. The microcrystalline silicon film thickness testing results of a substrate 206 are shown in Table II:

TABLE II

The unit of the film thickness is nm, the numbers in the parentheses is the location numbers in FIG. 7

| 982 | 1007 | 1019 | 1034 | 1029 | 1020 | 1015 | 997 |
|---|---|---|---|---|---|---|---|
| (1) | (2) | (3) | (4) | (5) | (6) | (7) | (8) |
| 991 | 1021 | 1035 | 1065 | 1050 | 1025 | 1027 | 1011 |
| (9) | (10) | (11) | (12) | (13) | (14) | (15) | (16) |
| 1027 | 1040 | 1039 | 1057 | 1045 | 1040 | 1028 | 1006 |
| (17) | (18) | (19) | (20) | (21) | (22) | (23) | (24) |
| 1025 | 1030 | 1037 | 1049 | 1034 | 1039 | 1034 | 1021 |
| (25) | (26) | (27) | (28) | (29) | (30) | (31) | (32) |
| 1013 | 1006 | 1009 | 1035 | 1030 | 1029 | 1025 | 1019 |
| (33) | (34) | (35) | (36) | (37) | (38) | (39) | (40) |

Figure 10:
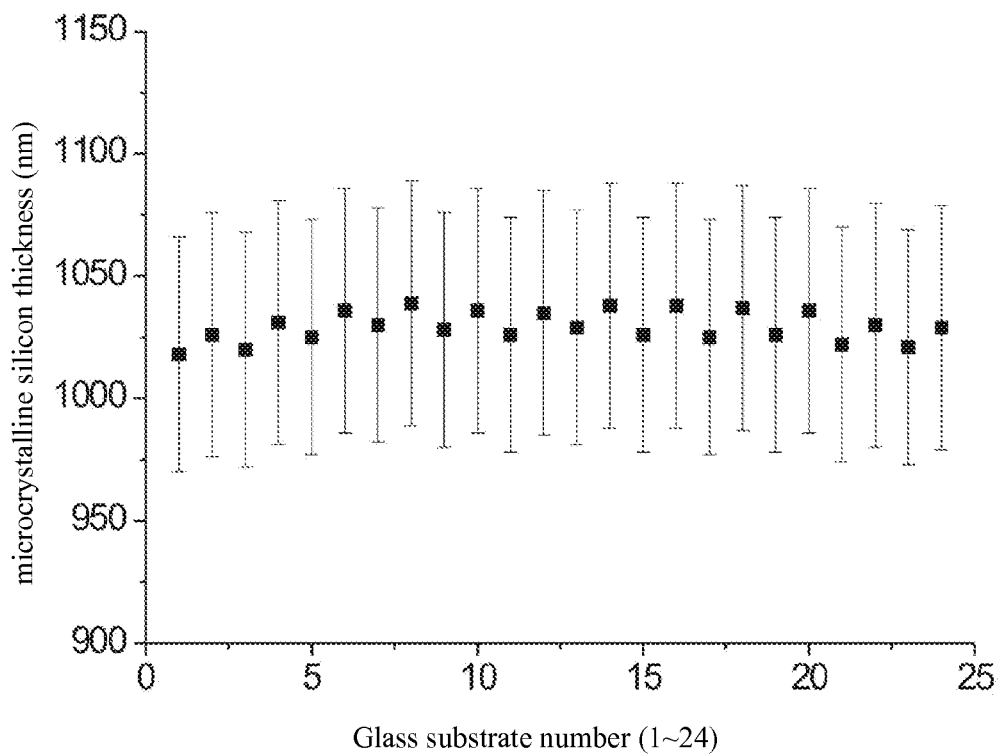
FIG. 10 illustrates thickness distributions of the microcrystalline silicon films deposited on the electrode plate by twenty-four different electrode glasses according to embodiment 3 of the present invention.

The differences of the microcrystalline silicon film thickness of the twenty four glass substrates is shown in FIG. 10.

Based on the above data, it can be determined that, with this feed-in configuration, uniform electric field driven by 40.68 MHz very-high-frequency power source can be achieved, and micro-crystalline silicon thin films can be deposited on 1640 mm×707 mm (length×width) TCO glass with a uniformity of ~4.8% and adjustable micro-crystallization degree.

Above descriptions illustrate embodiments of this invention in details together with the accompanying figures. However, the present invention is not limited to the above embodiments, especially with respect to the shape of the feed-in components. Those with ordinary skills in the art can make different changes to this invention without departing the principles of the present invention.

What is claimed is:

1. A discharge electrode array for thin-film solar cell deposition, comprising:
   electrode plate components; and
   signal feed-in components,
   wherein:
   the electrode plate components have shielding covers, and the covered electrode plate components and the signal feed-in components form the electrode array;
   the electrode array includes at least one group of cathode plates, an anode plate, and a pair of signal feed-in components;
   one end of each signal feed-in component connects with a feed-in port of a corresponding electrode plate component by surface contact to feed radio frequency (RF) or very high frequency (VHF) power supply signals to the feed-in port located in a hollowed area at the center of the backside of a cathode plate of the electrode plate component.

2. The discharge electrode array for thin-film solar cell deposition according to claim 1, wherein:
   the set of cathode plates and one anode plate are arranged such that two cathode plates are placed symmetrically, with working surfaces facing separately towards two sides of the anode plate for discharging.

3. The discharge electrode array for thin-film solar cell deposition according to claim 2, wherein:
   the electrode plate component includes a discharging space formed between a cathode plate, with a shielding cover and the feed-in port, and a grounded anode plate separated by a certain distance.

4. The discharge electrode array for thin-film solar cell deposition according to claim 1, wherein:
   the signal feed-in component includes a Z-shaped feed-in belt having a copper feeding core and an outside shielding layer; and
   one end of the signal feed-in belt is in a rectangular shape.

5. The discharge electrode array for thin-film solar cell deposition according to claim , wherein:
   the electrode plat component includes a single-surface-discharging cathode plate, a ceramic insulating layer, and a shielding cover: and
   the shielding cover covers entire back and side surfaces of the cathode plate.

6. The discharge electrode array for thin-film solar cell deposition according to claim 1, wherein:
   the electrode plate component includes a discharging space formed between a cathode plate, with a shielding cover and the feed-in port, and a grounded anode plate separated by a certain distance.

7. The discharge electrode array for thin-film solar cell deposition according to claim 6, wherein:
   the shielding cover includes shielding of the center position of back side and surrounding sides of the cathode plate for feeding in RF/VHF power supply signals.

8. The discharge electrode array for thin-film solar cell deposition according to claim 1, wherein:
the shielding cover includes shielding of the center position of back side and surrounding sides of the cathode plate for feeding in RFA/NF power supply signals.

9. The discharge electrode array for thin-film solar cell deposition according to claim 1, wherein:
one end of the signal feed-in component is connected with a negative output port of the RF/VHF power supply signals and a power supply matching device.

10. The discharge electrode array for thin-film solar cell deposition according to claim 1, wherein:
the electrode array includes multiple sets of signal feed-in components coupled to cathode plates with shielding covers and anode plates, whose number is less than half of that of the cathode plates, to form an array of electrode plates with a certain discharging distance.

11. A signal feed-in method for a discharge electrode array for thin-film solar cell deposition, comprising:
forming a surface feed-in electrode plate discharging mode using electrode plate components and feed-in components, wherein:
the electrode array with shielding covers includes at least a set of cathode plates, an anode plate, and a pair of signal feed-in components; and
one end of each signal feed-in component connects with a feed-in port of a corresponding electrode plate component by surface contact to feed radio frequency (RF) or very high frequency (VHF) power supply signals to the feed-in port located in a hollowed rectangular area at the center of the backside of a cathode plate of the electrode plate component.

12. The signal feed-in method for the discharge electrode array for thin-film solar cell deposition according to claim 11, wherein:
the electrode array includes multiple sets of signal feed-in components and electrode plate components: and the RFIVHF power supply signals are fed to feed-in port by the surface feed-in mode to form an array of electrodes with certain discharging distance.

13. The signal feed-in method for the discharge electrode array for thin-film solar cell according to claim 11, wherein:
one end of the signal feed-in component is in a rectangular shape and feeds the Radio Frequency (RF) or Very High Frequency (VHF) power supply signals by the surface feed-in mode to the feed-in port located in the hollowed rectangular area at the center of the backside of each cathode plate.

14. The signal feed-in method for the discharge electrode array for thin-film solar cell according to claim 13, wherein:
one end of the signal feed-in component is connected with a negative output port of the RF/VHF power supply sign Is and a power supply matching device.

15. The signal feed-in method for the discharge electrode array for thin-film solar cell according to claim 11, wherein:
the signal feed-in component includes a Z-shaped feed-in metal belt having an insulated and shielded outer shell, under which there are a ceramic insulating layer and a metal feeding core, the feeding core being a VHF feeding line.

\* \* \* \* \*